(12) United States Patent
Hertz

(10) Patent No.: US 6,202,918 B1
(45) Date of Patent: *Mar. 20, 2001

(54) METHOD AND APPARATUS FOR PLACING CONDUCTIVE PREFORMS

(76) Inventor: Eric Hertz, 1941 N. Federal Hwy., Boca Raton, FL (US) 33432

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/789,883

(22) Filed: Jan. 28, 1997

(51) Int. Cl.$^7$ .............................. B23K 31/02; B23K 1/00
(52) U.S. Cl. ............................................. 228/246; 228/41
(58) Field of Search ....................... 228/41, 246; 29/842, 29/884, 747

(56) References Cited

U.S. PATENT DOCUMENTS

| | | |
|---|---|---|
| 4,209,893 | 7/1980 | Dyce et al. . |
| 4,216,350 | 8/1980 | Reid . |
| 4,437,232 | 3/1984 | Araki et al. . |

(List continued on next page.)

FOREIGN PATENT DOCUMENTS

WO 9834749    8/1998   (WO) .

*Primary Examiner*—Patrick Ryan
*Assistant Examiner*—Lynn Edmondson

(57) ABSTRACT

A method and apparatus are disclosed for placing solder balls 201 on electronic pads 1204 on a substrate 1202, such as for a ball grid array (BGA) applicator 10. The solder balls 201 are held to openings 102 in a foil 22 such as by vacuum force 1607 applied to the solder balls 201 through the openings 102 in a foil 22. After locating the solder balls 201 at electronic pads 1204 on a substrate 1202, by deactivating the vacuum force 1607 and optionally applying a release force 1703 the solder balls 201 are released and placed on the electronic pads 1204. Optionally, a release mechanism 2400 applies placing force 2600 to the solder balls 201 through the openings 2404 in the foil 2403.

23 Claims, 15 Drawing Sheets

U.S. PATENT DOCUMENTS

| | | |
|---|---|---|
| 4,684,055 | 8/1987 | Baer et al. . |
| 4,712,721 | 12/1987 | Noel et al. . |
| 4,722,470 | 2/1988 | Johary . |
| 4,733,823 | 3/1988 | Waggener et al. . |
| 4,842,184 | 3/1989 | Miller, Jr. . |
| 4,871,110 * | 10/1989 | Fukasawa et al. ............ 228/41 |
| 4,872,261 | 10/1989 | Sanyal et al. . |
| 4,898,320 | 2/1990 | Dunaway et al. . |
| 4,903,889 | 2/1990 | Svendsen et al. . |
| 4,906,832 | 3/1990 | Kushima et al. . |
| 5,029,748 | 7/1991 | Lauterbach et al. . |
| 5,048,747 | 9/1991 | Clark et al. . |
| 5,088,639 * | 2/1992 | Gondotra et al. ............ 228/180.1 |
| 5,107,759 | 4/1992 | Omori ............ 101/114 |
| 5,108,024 | 4/1992 | Kazem-Goudarzi et al. . |
| 5,118,027 | 6/1992 | Braun et al. . |
| 5,118,584 | 2/1992 | Evans et al. . |
| 5,148,375 | 9/1992 | Horikami . |
| 5,159,535 | 10/1992 | Desai et al. . |
| 5,172,853 | 12/1992 | Maiwald . |
| 5,205,896 * | 4/1993 | Brown et al. ............ 156/297 |
| 5,211,328 | 5/1993 | Ameen et al. . |
| 5,219,117 | 6/1993 | Lin . |
| 5,220,200 | 6/1993 | Blanton . |
| 5,254,362 | 10/1993 | Shaffer et al. . |
| 5,255,839 * | 10/1993 | Da Costa Alves et al. ......... 228/246 |
| 5,256,838 | 10/1994 | Kim . |
| 5,261,593 | 11/1993 | Casson et al. . |
| 5,275,970 | 1/1994 | Itoh et al. . |
| 5,284,287 | 2/1994 | Wilson et al. . |
| 5,289,631 | 3/1994 | Koopman et al. . |
| 5,323,947 | 6/1994 | Juskey et al. . |
| 5,356,658 | 10/1994 | Hertz et al. . |
| 5,363,277 | 11/1994 | Tamaka . |
| 5,373,984 | 12/1994 | Wentworth . |
| 5,388,327 | 2/1995 | Trabucco . |
| 5,392,980 | 2/1995 | Swamy ............ 228/119 |
| 5,431,332 | 7/1995 | Kirby ............ 228/41 |
| 5,438,223 | 8/1995 | Higashi et al. . |
| 5,445,313 | 8/1995 | Boyd et al. . |
| 5,454,159 | 10/1995 | Norell . |
| 5,467,913 | 11/1995 | Namekawa et al. . |
| 5,492,266 | 2/1996 | Hoebener et al. . |
| 5,497,938 | 3/1996 | McMqhon et al. . |
| 5,499,487 | 3/1996 | McGill . |
| 5,511,306 | 4/1996 | Denton et al. . |
| 5,519,580 | 5/1996 | Nataraian et al. . |
| 5,540,377 | 7/1996 | Ito . |
| 5,542,601 | 8/1996 | Fallon ............ 228/119 |
| 5,547,530 | 8/1996 | Kakamura et al. . |
| 5,551,216 | 9/1996 | McGill . |
| 5,574,801 | 11/1996 | Collet-Beillon . |
| 5,601,226 * | 2/1997 | Nakazoto et al. ............ 228/246 |
| 5,601,229 | 2/1997 | Nakazato et al. . |
| 5,607,099 | 3/1997 | Yeh et al. . |
| 5,620,129 | 4/1997 | Rogren . |
| 5,620,927 * | 5/1995 | Lee ............ 29/841 |
| 5,626,277 | 5/1997 | Kawada . |
| 5,655,704 * | 8/1997 | Sakemi et al. ............ 228/246 |
| 5,657,528 | 8/1995 | Sakemi et al. . |
| 5,662,262 | 9/1997 | McMahon et al. . |
| 5,680,984 | 10/1997 | Sakemi . |
| 5,683,942 | 11/1997 | Kata et al. . |
| 5,685,477 * | 6/1995 | Mallik et al. ............ 228/254 |
| 5,704,536 | 1/1998 | Chen et al. . |
| 5,749,614 * | 12/1995 | Reid et al. ............ 294/64.1 |
| 5,762,258 * | 7/1996 | Le Coz et al. ............ 228/56.3 |
| 5,765,744 | 6/1998 | Tatumi et al. . |
| 5,816,482 * | 4/1996 | Grabbe ............ 228/212 |
| 5,839,641 | 11/1998 | Teng . |
| 5,918,792 | 7/1999 | Stumpe et al. . |
| 5,921,458 | 7/1999 | Fan et al. . |

* cited by examiner

METHOD AND APPARATUS FOR PLACING CONDUCTIVE PREFORMS

FIELD OF THE INVENTION

This invention relates in general to the field of conductive preform placement systems for surface mount technology, and in particular to a method and apparatus for placing solder balls on electronic pads that are on a substrate such as for a ball grid array (BGA) applicator.

BACKGROUND OF THE INVENTION

Conventional methods for manufacturing surface mount components, or for manufacturing circuit supporting substrates for surface mount components, typically include methods for placing conductive preforms, e.g., solder balls, solder spheres, and preformed solder bumps, on electronic pads arranged in a predetermined placement pattern that is sometimes called a ball grid array (BGA).

A known method for placing solder bumps on electronic pads on a substrate utilizes a stencil placed over the electronic pads on the substrate to guide solder paste to flow through openings in the stencil plate onto the electronic pads. The solder paste is typically spread over the stencil using a squeegee to remove the excess solder paste. After the stencil is removed from the substrate, solder bumps are formed on, and remain attached to, the electronic pads. This method technically forms the solder bumps on the electronic pads and does not place solder that has been preformed on the electronic pads.

The solder paste, as formed in this method, has a tendency to develop internal structural defects, such as voids, or variation of fused solder volumes during the fusing process, thereby introducing potential defects to the manufacturing process or risk of failure during the life of the product. This is an undesirable consequence of this method.

A first known method for placing solder balls on electronic pads on a substrate utilizes a stencil plate placed over the electronic pads on the substrate to guide solder balls to drop through openings in the stencil plate onto the electronic pads. The electronic pads having been pre-printed with solder paste, the solder balls then adhere to the electronic pads via the solder paste. During a reflow operation, the solder balls fuse to the electronic pads on the substrate.

Besides requiring a guiding force to reliably introduce the solder balls into the openings in the stencil plate, this method additionally suffers from a hot-air knife reflow heating step that unevenly distributes heat over the solder balls in the stencil plate. Further, the heating step applied while the solder balls are in the stencil may cause the solder to melt and adhere to the stencil. Furthermore, a heating-knife motion control mechanism can be expensive.

A second known method for placing solder balls on electronic pads on a substrate utilizes tubes to hold the solder balls over the electronic pads. Each tube applies a vacuum force to hold a solder ball to the end of the tube. After locating the tubes holding the solder balls over the electronic pads, the solder balls are placed on the electronic pads by removing the vacuum force from the tubes and vertically vibrating the tubes to release the solder balls onto the electronic pads.

The apparatus for this second method tends to be complicated and can be expensive to produce and maintain. Since the solder balls are placed sequentially, the process is not conducive to cycle time. It also may not be suitable for micro-BGA placement where the pitch of the pads is very fine and requires tight tolerances in locating the solder spheres.

A third known method for placing solder balls on electronic pads on a substrate utilizes a plate with solder bumps attached to the plate in a pattern corresponding to the pattern of the electronic pads on the substrate. The solder bumps are attached to the plate by etching a pattern of openings in a photoresist mask over the plate according to a predefined artwork, and then depositing solder composition on the plate at the openings (where the plate surface is exposed) by an electroplating operation. Lastly, after removing the photoresist layer, the solder bumps remain attached to plate. The solder bumps are then placed on the electronic pads on the substrate by positioning the plate over the electronic pads to allow the solder bumps to contact the electronic pads. By heating the entire assembly, the solder bumps melt and transfer onto the electronic pads.

Besides constituting a relatively expensive process to implement in a mass production environment, this method requires trained operators to perform numerous steps, including chemical processing steps that can subject an operator to environmental hazards. The overall process, therefore, can be environmentally unfriendly, time consuming, expensive, and generally requiring trained operators to be effective.

Thus, what is necessary is a low cost and efficient method and apparatus for placing conductive preforms on pads on a component, or on a substrate.

SUMMARY OF THE INVENTION

One aspect of the present invention is to provide a low cost tool for locating and placing the conductive preforms onto the pads of substrates or components. The tool preferably comprises a foil structure that includes a plurality of openings that are used to hold and place the conductive preforms onto the pads.

Another aspect of the present invention is the use of artwork and a photodeveloping and etching process on the foil to create the openings. This eliminates significant variation in locating and forming the openings in the foil while maintaining a low cost for the tool. As the distance between pads (pitch) decreases, such as for fine pitch BGA manufacturing, the variation in locating and shaping the openings becomes significantly more critical for maintaining an accurate and reliable conductive preform placement process.

Another aspect of the present invention is the ability to facilitate changing a pattern of openings on a foil for placing conductive preforms on different arrangements (patterns) of pads. By using different foils with different etched patterns (different patterns of openings etched in the foils), the low cost tool can efficiently place conductive preforms on different patterns of pads on a substrate.

Another aspect of the present invention is the ability to include a mechanism to assist with releasing the conductive preforms from the openings in the foil to reliably place the conductive preforms on the pads while overcoming friction or tack at the openings in the foil.

Another aspect of the present invention is the ability to include a mechanism to hold the conductive preforms at the openings in the foil and then remove the holding force to place the conductive preforms on the pads.

Another aspect of the present invention is the ability to create a taper in the openings of the foil to attain a better process for accounting for tolerances, securing, and releasing the conductive preforms. The taper can preferably be varied by modifying the artwork for the two opposing sides of the foil.

DETAILED DESCRIPTION OF THE INVENTION

Figure 1:
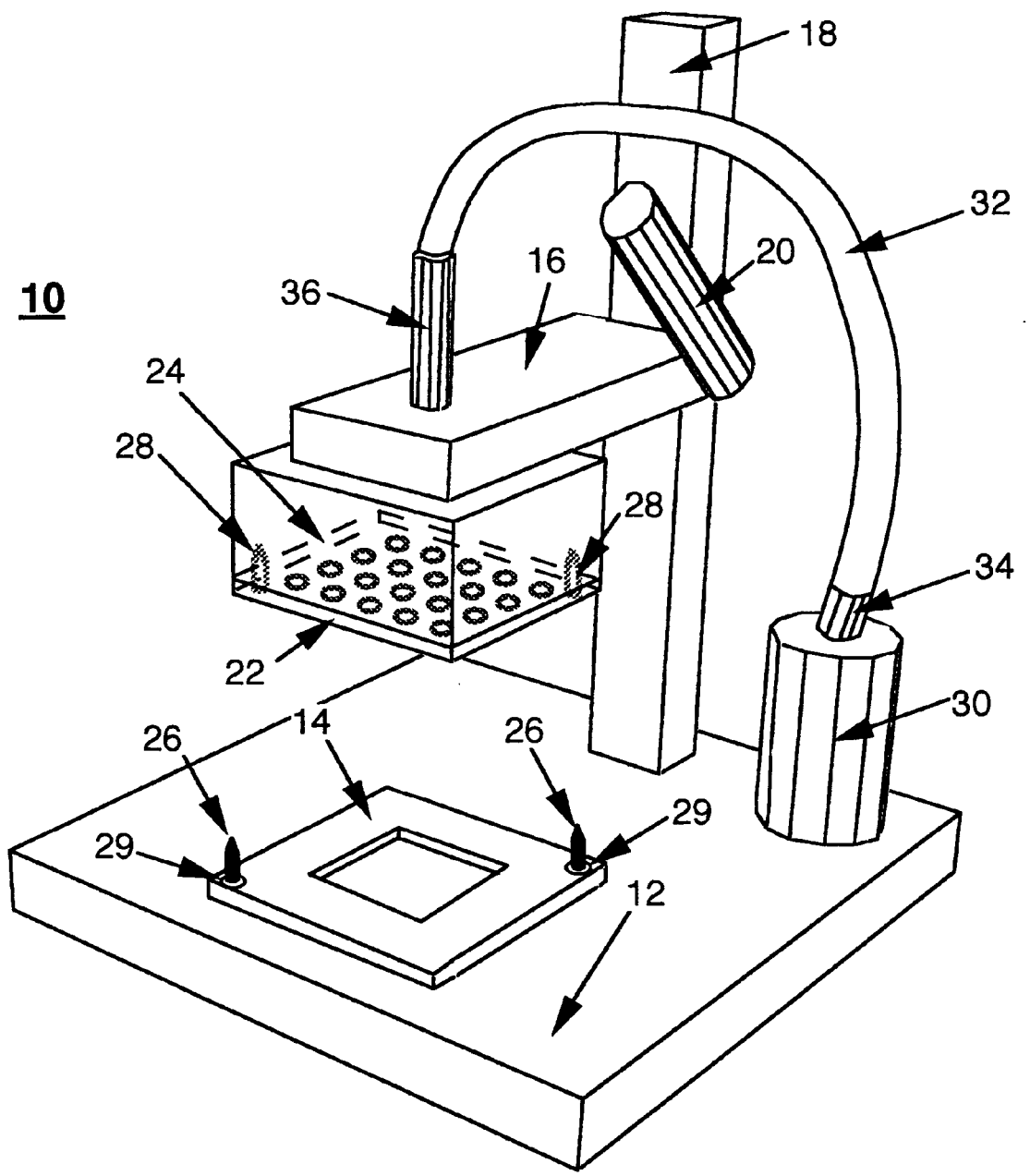
FIG. 1 is an isometric view of a Ball Grid Array Applicator apparatus, according to a preferred embodiment of the present invention.

FIG. 1 illustrates an isometric view of a ball grid array (BGA) applicator 10 in accordance with a preferred embodiment of the present invention. A platform 12 supports an alignment plate 14 and a movable placement apparatus 16 that is arranged to move along an axis substantially perpendicular to the alignment plate 14.

In a preferred manual configuration, the movable placement apparatus 16 is movably coupled to a supporting beam 18 that is supported by the platform 12. The movable placement apparatus 16 includes a gripping mechanism (not shown) that can be activated by rotation of a lever 20 to allow axial movement of the movable placement apparatus 16 along the axis substantially perpendicular to the alignment plate 14. A track (not shown) along the length of the supporting beam 18 slidably mates with a bracket (not shown) on the movable placement apparatus 16 to provide a guide for the movable placement apparatus 16 to move along the axis.

In an automatic configuration, an automated equipment, or a robotic arm and end-effector, (not shown) could constitute the movable placement apparatus 16 that automatically moves along the axis substantially perpendicular to the alignment plate 14 according to a predetermined operational sequence, such as a programmed set of instructions at a robotic station (not shown).

Mechanically coupled to the movable placement apparatus 16, and oriented to substantially oppose the alignment plate 14, is a foil 22 coupled to a block structure 24 according to a construction and arrangement that will be fully discussed below.

In a preferred configuration of the BGA applicator 10, two aligning pins 26 are affixed on, and perpendicular to, the platform 12 to cooperatively mate with alignment apertures 29 in the alignment plate 14, and alignment apertures 28 in the block structure 24. The aligning pins 26 mate with the alignment apertures 28 to provide a reliable alignment mechanism for the block structure 24 and the alignment plate 14. In this way, the foil 22 can be reliably moved by the movable placement apparatus 16 along the axis perpendicular to the alignment plate 14 to perform a placement operation, as will be more fully discussed below.

In one embodiment, a vacuum source 30 is pneumatically coupled to a port (not shown) in the block structure 24, such as via a flexible hose 32 and connectors 34,36. The vacuum source 30, when activated, delivers a first vacuum force to the port in the block structure 24. When deactivated, the vacuum source 30 then delivers a second (zero) vacuum force to the port in the block structure 24. In this way, a vacuum force can be applied to the port in the block structure 24 for a placement operational sequence using the foil 22 and block structure 24, as will be more fully discussed below.

Figure 2:
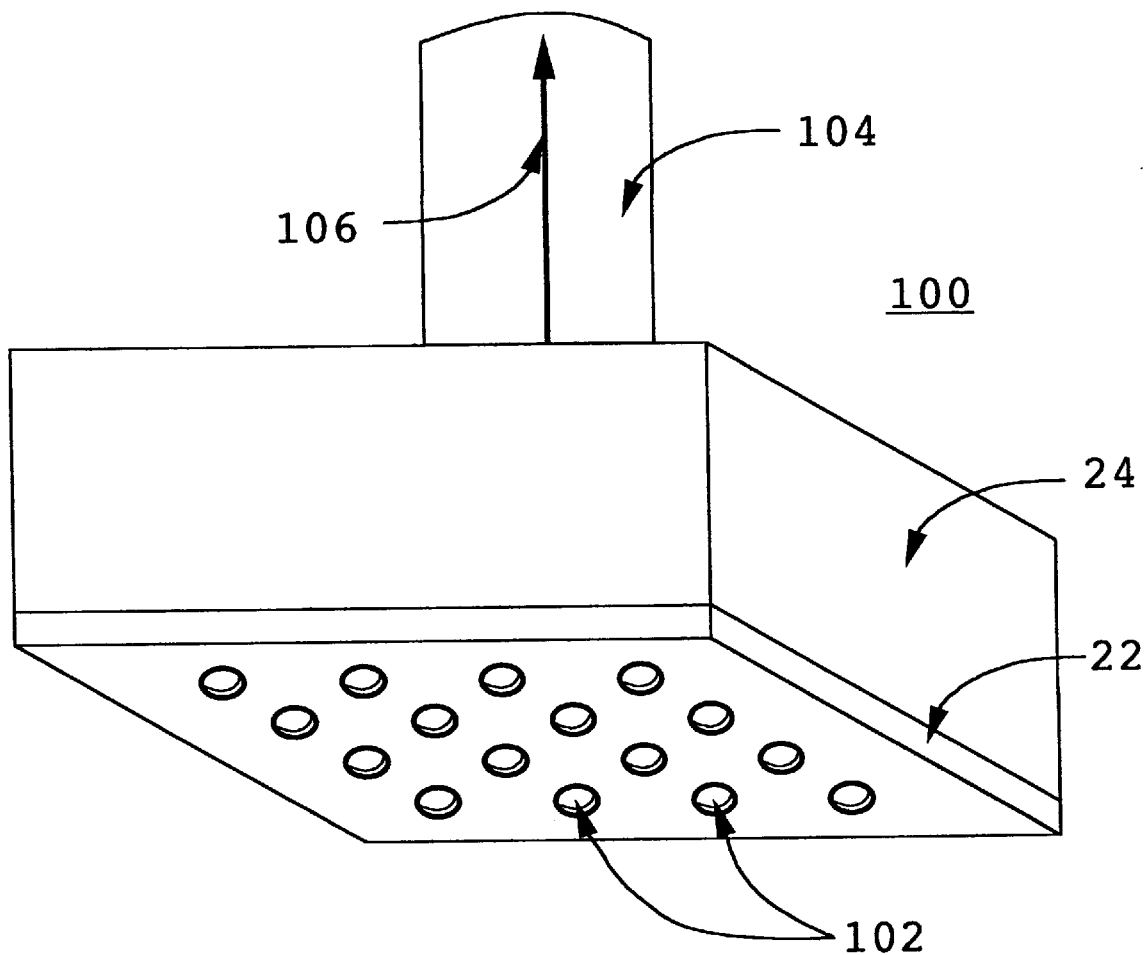
FIG. 2 is an isometric view of a foil and block structure representing a portion of a conductive preform placement apparatus, according to a preferred embodiment of the present invention.

Referring to FIG. 2, according to a preferred embodiment of the present invention, a foil 22 is coupled to a block structure 24. The foil 22 has a pattern of openings 102 created therein to match a pattern of pads (not shown) located on a substrate (not shown), such as to match a pattern of electronic pads on a component or on a circuit supporting substrate. Preferably, the pattern of openings 102 is created using an etching process with a predefined artwork for accurately locating and shaping the openings, as will be more fully discussed below.

The block structure 24 includes a main vacuum port 104 located about the top portion of the block structure 24 and pneumatically coupled to an external vacuum source 30 (see FIG. 1). A vacuum force 106 is provided to the vacuum port 104 and thereby routed through channels (not shown) to chambers (not shown) in the block structure 24. The completed block assembly is illustrated as 100.

Figure 3:
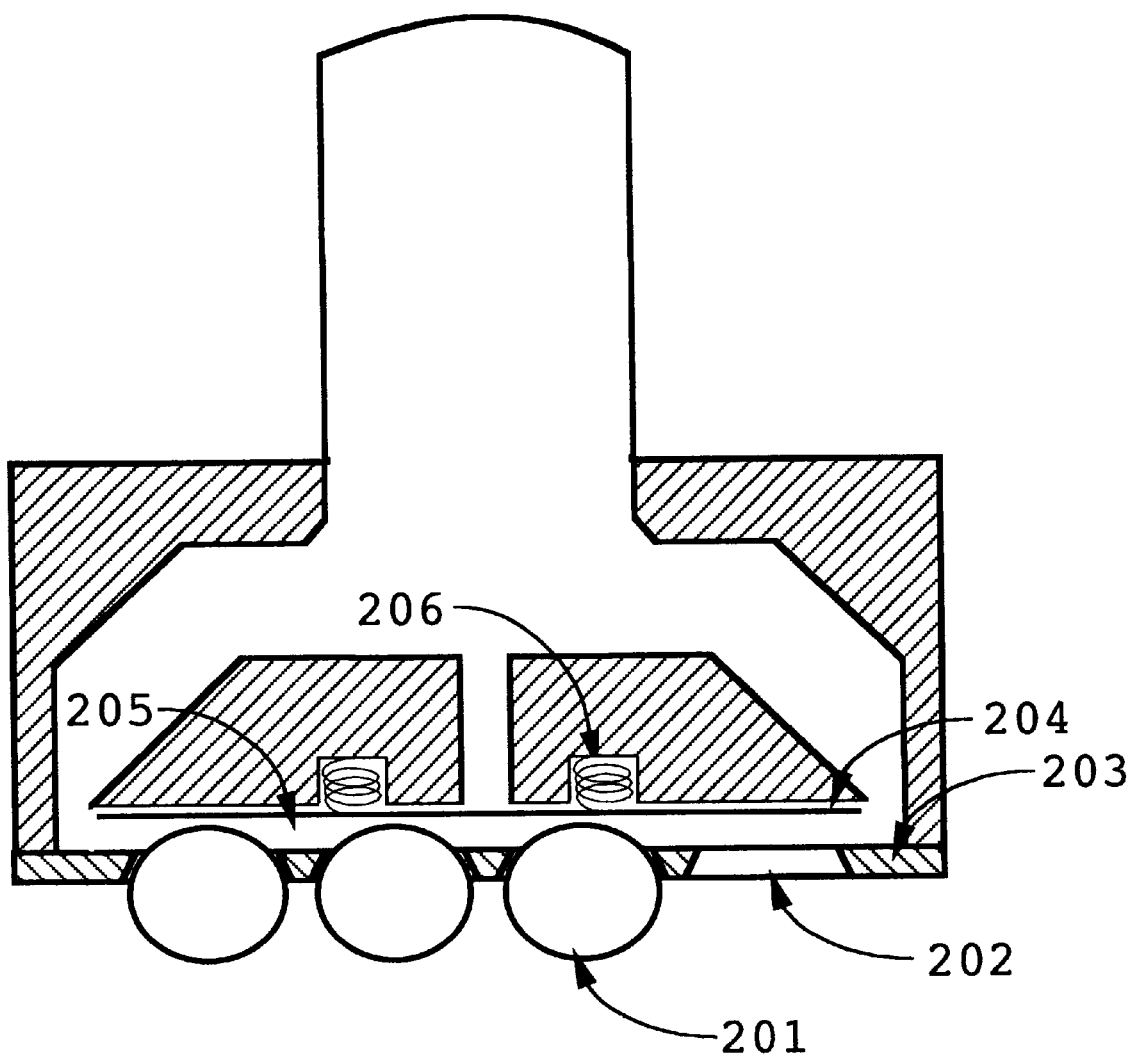
FIG. 3 is a cross sectional view of the foil and block structure of FIG. 2, additionally showing solder balls being held at openings in the foil and the optional release system.

FIG. 3 is a cross-sectional view of the block structure 24 and foil 22 of FIG. 2, illustrating solder spheres 201 positioned in openings 202 of the foil pattern 102. The solder spheres 201 are arranged in the. trapezoidal cross sectional apertures 202 of the foil 203. The optional release mechanism is comprised of a release plate 204 used to separate the solder spheres 201 from the apertures 202 of the foil 102 after they are in position and a release plate spring 206 used to assist in the manipulation of the release plate 204. The plate 204 and spring 206 are located in the release mechanism vacuum chamber 205.

Figure 4:
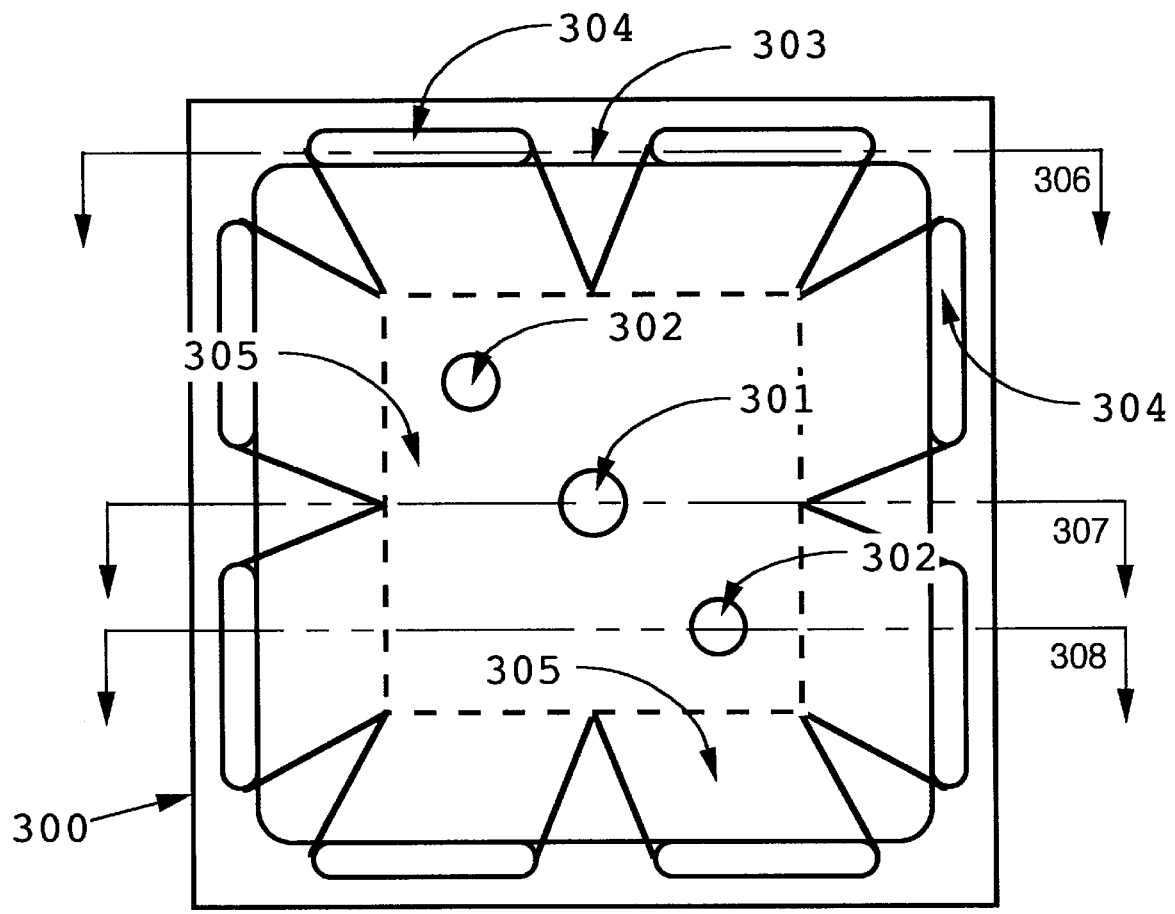
FIG. 4 is a bottom side plan view of a block structure constructed in accordance with a preferred embodiment of the present invention.

FIG. 4 is a bottom side plan view of a block structure constructed in accordance with a preferred embodiment of the present invention. The bottom side plan view of the block structure illustrates the outline of the block structure 300, the vacuum chamber 301 for actuating the release plate 204, the release plate spring locations 302 which secure the release plate spring(s) 206, the release plate relief area 303, the vacuum chambers 304 for lifting and securing the conductive preforms, and the vacuum chamber distribution network 305. FIG. 4 illustrates the reference locations for cross sectional side views, FIG. 5 306, FIG. 6 307, and FIG. 7 308.

Figure 5:
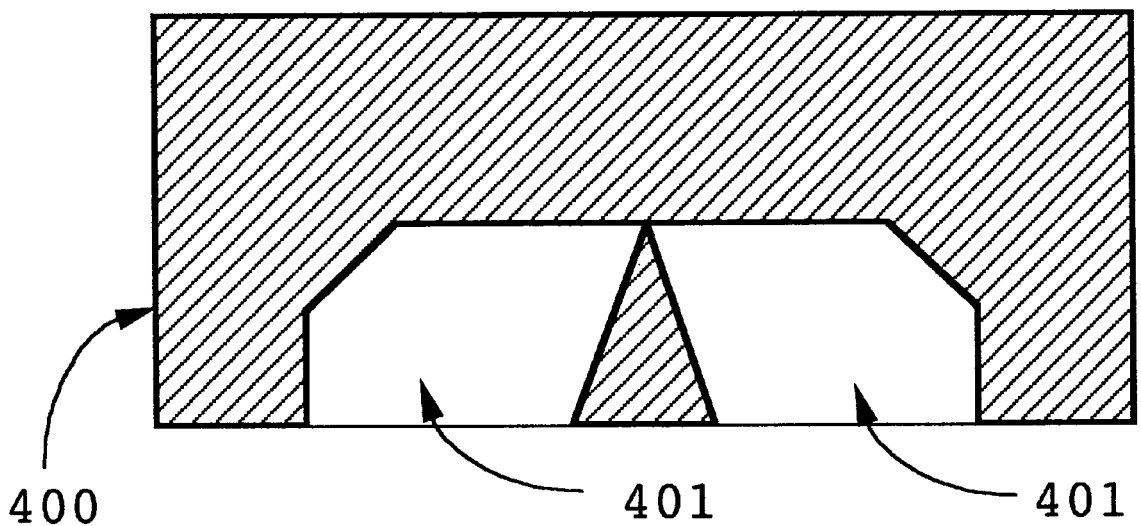
FIGS. 5, 6, and 7 are cross-sectional side views of the block structure of FIG. 4.
Figure 6:
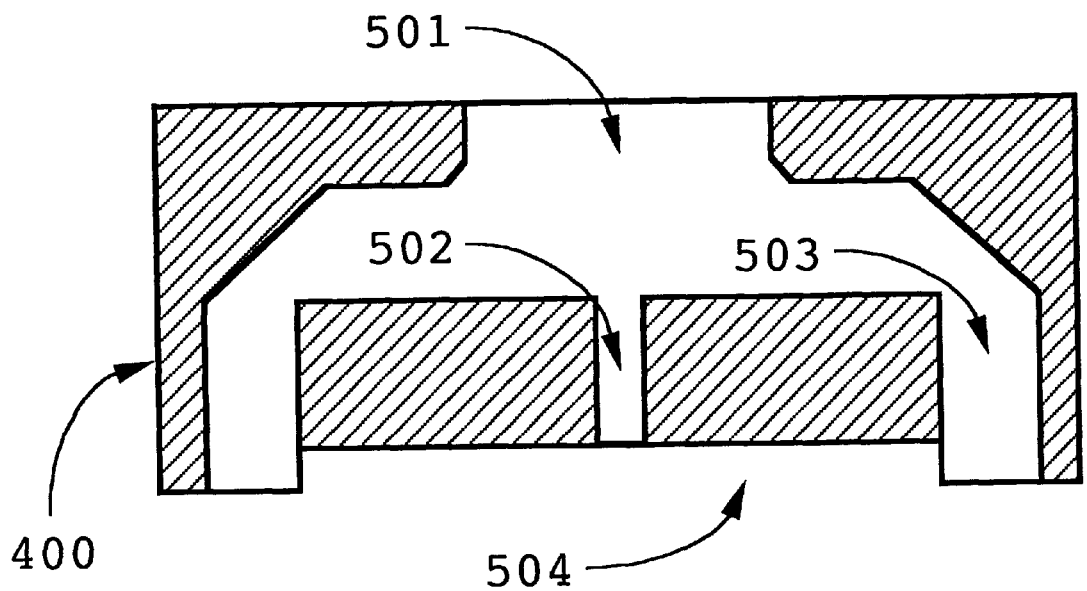
Figure 7:
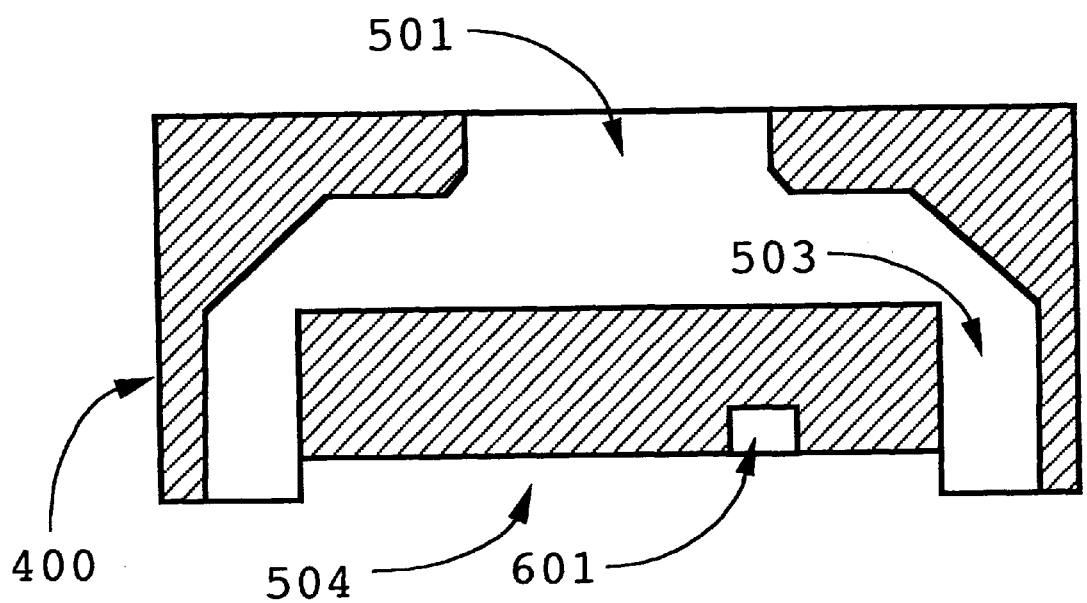

FIGS. 5, 6, and 7 are cross-sectional side views of the block structure of FIG. 4. FIG. 5 is a cross sectional side view of the block structure through the vacuum chambers outside the release plate relief area 306 illustrating the outline of the block structure 400 and a cross sectional view of the vacuum chambers 401 for lifting and securing the conductive preforms.

FIG. 6 is a cross sectional view of the block structure across the center of the block 307 illustrating the outline of the block structure 400, a cross sectional view of the vacuum chamber distribution network 501, the at least one vacuum chamber for actuating the release plate 502, the at least one vacuum chamber 503 for lifting and securing the conductive preforms, and the release plate relief area 504.

FIG. 7 is a cross sectional view of the block structure across the block at center of the release plate release operating mechanism 308 illustrating the outline of the block structure 400, a cross sectional view of the vacuum chamber distribution network 501, the vacuum chambers 503 for lifting and securing the conductive preforms, the release plate relief area 504, and the location of the release plate release operating mechanism 601.

FIGS. 8, 9, 10, and 11 are cross-sectional side views of a foil and represent steps in making the foil according to a preferred embodiment of the present invention.

Figure 8:
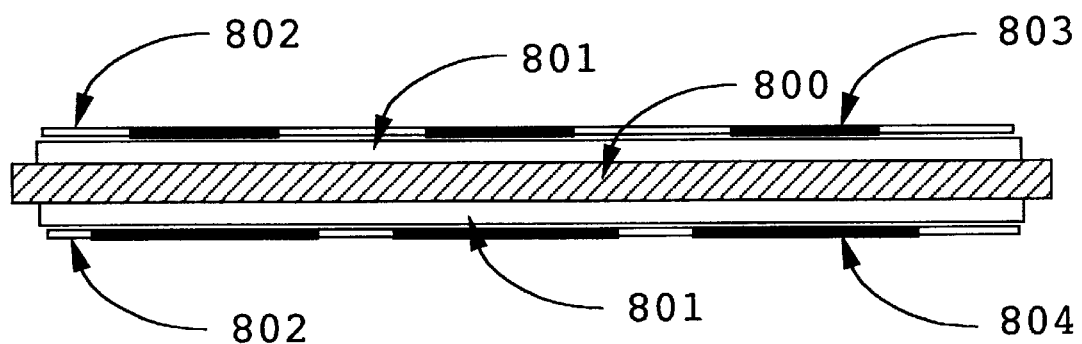
FIGS. 8, 9, 10, and 11 are cross-sectional side views of a foil and represent steps in making the foil according to a preferred embodiment of the present invention.

FIG. 8 illustrates the raw material for the foil 800 in pre-etched state. The raw material for the foil 800 may consist of, but is not limited to stainless steel, brass, kapton, copper, nickel, etc. Phototooling 801 is laminated to both sides of the raw material for the foil 800. Phototooling 801 can be described as a chemical or material that changes state when exposed to a light source. The artwork 802 is placed on both sides of the foil above the phototool 801. The artwork 802 blocks the light from the phototooling resulting in the transfer of the desired pattern. The phototooling 801 which is exposed to light is cured, and the phototooling 801 which is not exposed to light is not cured and is removed, resulting in a negative of the pattern on the foil. The pattern 803 on one side of the foil may purposely be of a different size compared to the pattern 804 on the opposing side.

Figure 9:
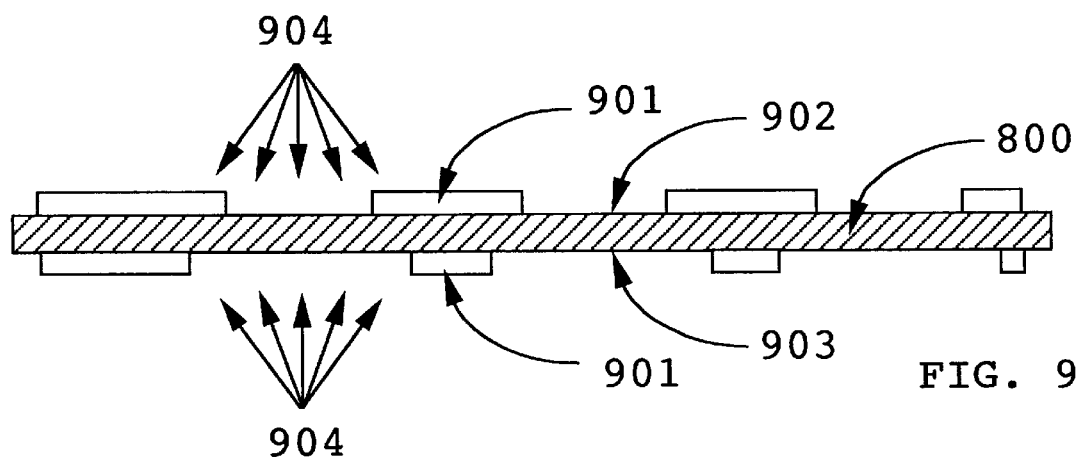

FIG. 9 illustrates the raw material of the foil 800 prepared to be chemically etched. The raw material of the foil 800 has the exposed phototooling 901 after the artwork 801 (not shown) has been removed, a pattern 902 on one side, and a pattern of optionally different size 903 on the opposing side. The raw material of the foil 800 with the laminated, developed phototooling 901 is subjecting the assembly to a chemical 904 with properties which remove the raw material of the foil 800 not coated with exposed phototooling 902 and 903.

Figure 10:
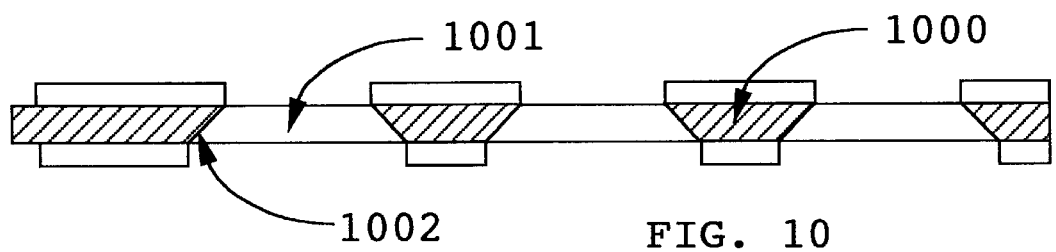

FIG. 10 illustrates a cross section of the foil 1000 in a post etch state. The removed material creates an aperture 1001. The resultant optional trapezoidal cross section 1002 is illustrated as created by utilizing the optionally different sized patterns on opposing sides of the foil.

Figure 11:
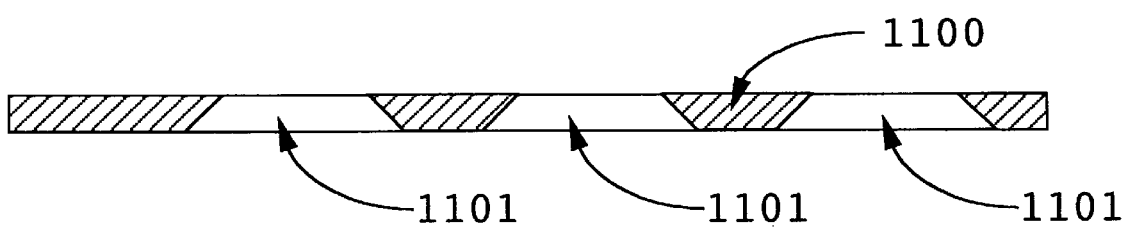

FIG. 11 illustrates a cross section of the foil 1100 in a post etch state with the phototooling removed. The pattern 1101 can optionally be enhanced by additional post etch processing including but not limited to plating alternative materials such as Teflon, copper, silver, nickel, or gold to the etched foil or electropolishing the etched foil.

Figure 12:
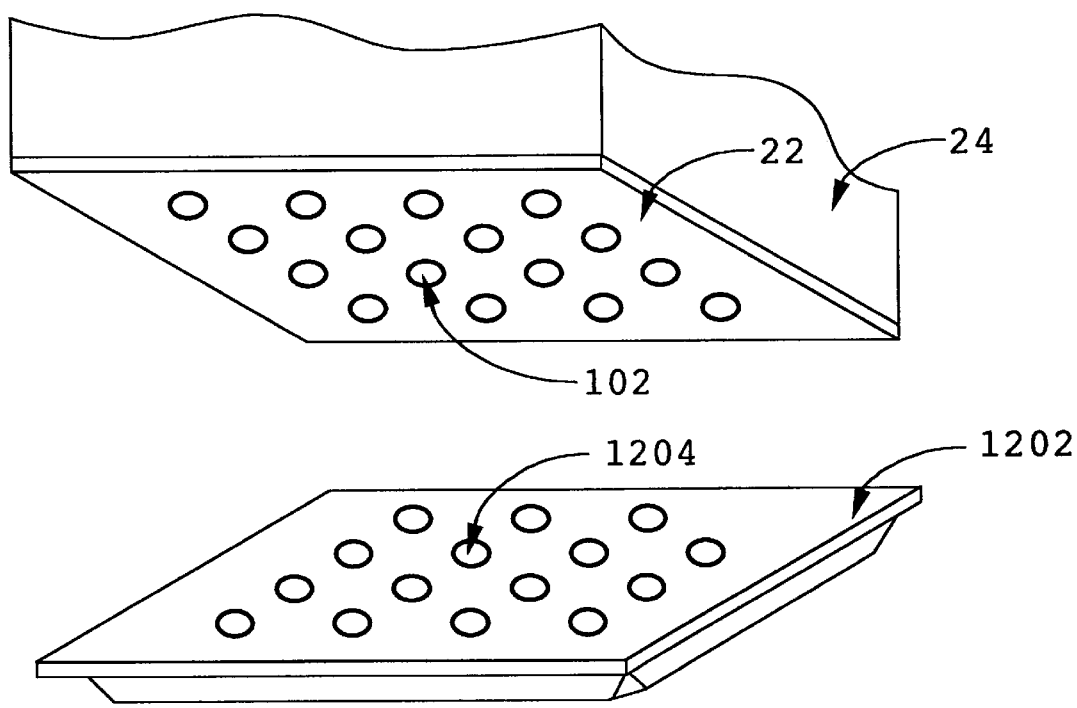
FIG. 12 is an isometric view of a foil located in proximity with a component.

FIG. 12 illustrates a foil 22 coupled to a block structure 24 located in proximity with a component 1202.

The pattern of openings 102 in the foil 22 is created to match a pattern of pads 1204 located on the component 1202.

Preferably, the pattern of openings 102 is created using predefined artwork and a photodeveloping and a chemical etching process.

Figure 13:
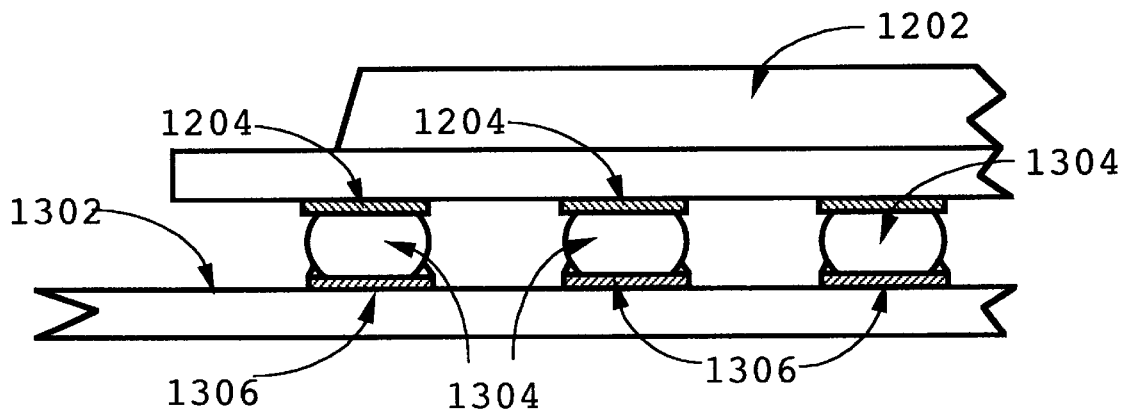
FIG. 13 is a cross-sectional side view of a component installed on a circuit supporting substrate.

FIG. 13 is a view of the component 1202 and a corresponding receiving circuit supporting substrate 1302. The pads 1204 on the component 1202 are typically prebumped with conductive preforms, such as with solder balls 1304. When the component 1202 is placed on the circuit supporting substrate 1302, the solder balls 1304 electrically and mechanically couple the pads 1204 on the component 1202 and the pads 1306 on the circuit supporting substrate 1302.

Figure 14:
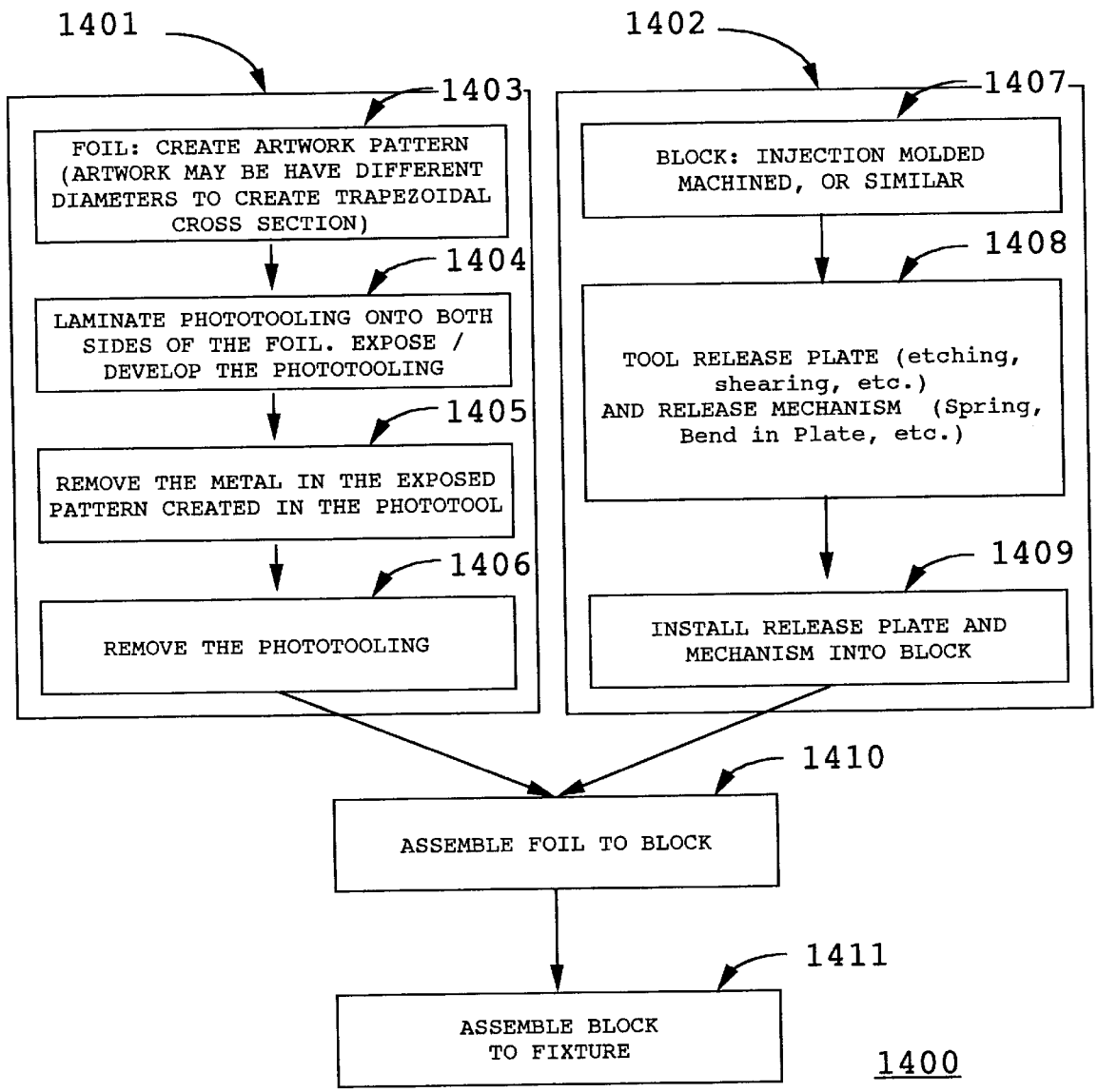
FIG. 14 is a flow diagram for a manufacturing process for a ball grid array applicator, according to a preferred embodiment of the present invention.

FIG. 14 is a flow diagram 1400 illustrating a preferred manufacturing process for the foil 22 and the block structure 24 of the BGA applicator 10, according to a preferred embodiment of the present invention. The manufacturing process describes a method 1401 for tooling the foil 102 and a method 1402 for tooling the block 100. Numerous methods to create apertures within a foil are well known, with the most common described in the process flow 1401. The first step 1403 to create the foil 102 is to create artwork with the required pattern. Two artworks 802 are required, one for each side of the foil 102. The artwork 802 can be created such that the diameter of each circle of the pattern on the first artwork 803 is different from the corresponding circles of the pattern on the second artwork 804. This difference results in a trapezoidal cross section 1002 when the foil is etched. The second step 1404 to create the foil 102 is to laminate the proper phototooling 801 onto both sides of the foil 102, develop the phototooling 901, and remove the non-developed portion of the phototooling leaving exposed metal 902 and 903. Once completed the phototooling creates a negative of the pattern on the raw material of the foil 800. The third step 1405 to create the foil 102 is to remove the exposed metal 902 and 903 by a chemically etching process. The forth and final step 1406 to create the foil 102 is to remove the phototooling 901. The first step 1407 to create the block structure 24 is to form the block by either molding, machining or similar. The second step 1408 to create the block structure 24 is to create the release plate 204 and mechanism 206. The third step 1409 to create the block structure 24 is to assemble the release plate 204 and mechanism 206 into the block 100. Upon completion of the foil 102 and the block structure 24, the next step 1410 is to couple the two assemblies together to complete the apparatus 100. The final step 1411 would be to install the apparatus 100 onto the vacuum source 30 via a flexible hose 32 and connectors 34,36.

Figure 15:
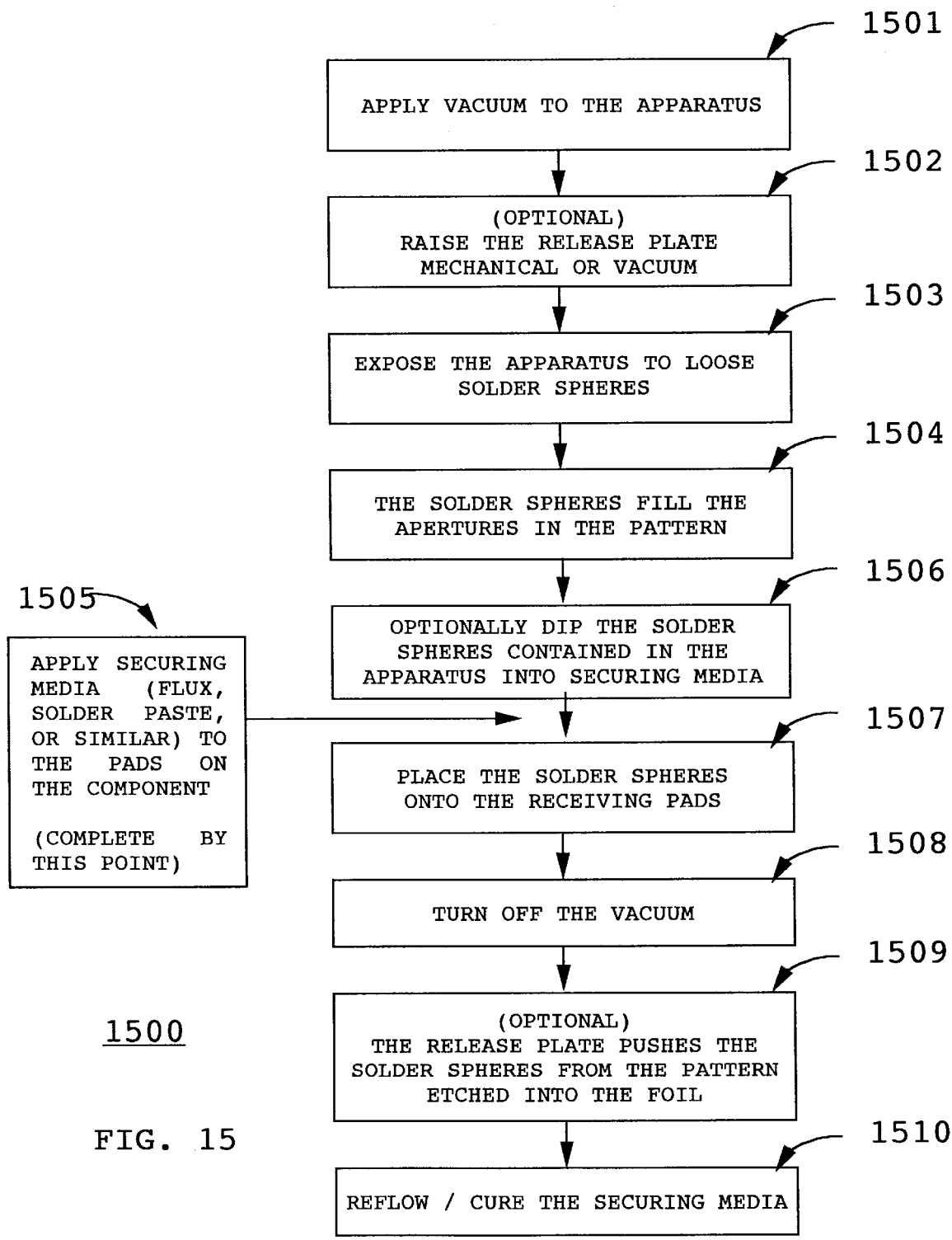
FIG. 15 is an operational flow diagram illustrating a method, according to a preferred embodiment, for using the ball grid array applicator to place solder balls onto pads.

FIG. 15 is an operational flow diagram 1500 demonstrating the method of applying the conductive preforms to a pattern of pads 1204 or 1306. The first step 1501 to applying the solder spheres 201 is to create a vacuum 106 within the vacuum chamber 104. The second step 1502 is optional; raise the release plate 204 either mechanically, utilizing the vacuum, mechanical, or alternative process. The third step 1503 is to expose the apparatus 100 to a container of loose conductive preforms, where the preferred embodiment would be solder spheres 201. The forth step 1504 results from the third step 1503 where the vacuum will lift the loose solder spheres 201 and hold one sphere per aperture 202 of the pattern 102. The fifth step 1505 is to apply a media which is used to temporarily secure the solder spheres 201 to either the pads 1204 on the component 1202 or the pads 1306 on the receiving substrate 1302. One method 1505 which can be used would be to apply a media (flux, solder paste, conductive epoxy, etc.) directly to the receiving pads by dispensing, printing or other well known processes. An alternative method 1506 which can be used is to dip the solder spheres 201 into a trough with a predetermined thickness of the media. The sixth step 1507 to applying the solder spheres 201 is to place the solder spheres onto the receiving pads 1204 or 1306. The seventh step 1508 to applying the solder spheres 201 to the receiving pads 1204 or 1306 is to release the solder spheres 201 from the apparatus 100 by turning off the vacuum 105. The eighth step 1509 uses the optional release mechanism to aid in removing the solder spheres 201 from the apertures 202 in the foil 203. When the vacuum is deactivated (zero vacuum is applied) to the apparatus 100, the spring 206 pushes the release plate 204 towards the foil 102. The resulting action separates the solder spheres 201 from the apertures 202 in the foil 102. It can be recognized that the release mechanism can alternatively operate by coupling the spring to the foil, decreasing the spring force to place the release plate in the load position towards the block structure, then apply a force to the release plate, with the resultant action increasing the spring force, moving the release plate towards the foil, and separating the solder spheres 201 from the apertures 202 in the foil 102.

The ninth step 1510 in the process is to bond the solder spheres to the receiving pads 1204 or 1306. The bonding process would be respective of the material used for the securing media. Some examples would be reflow for flux or solder paste or curing for conductive epoxy.

Figure 16:
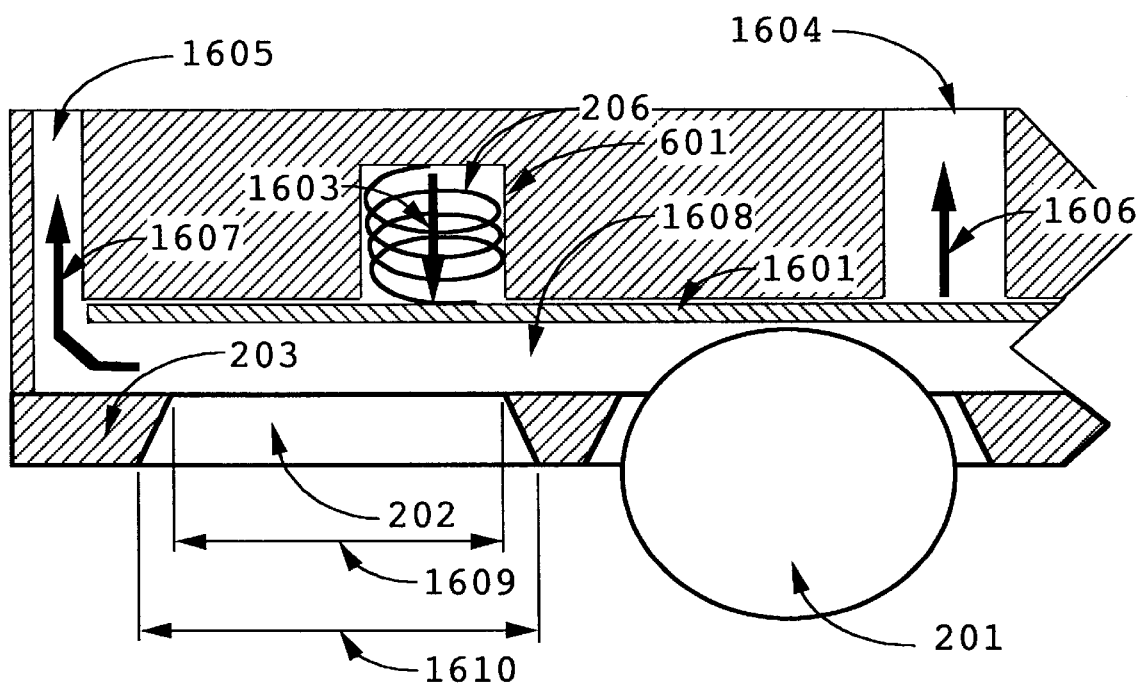
FIG. 16 is an exploded cross-sectional side view of a foil and block structure with a release plate in a "load" position.

FIG. 16 is a cross-sectional side view of a foil 22 and block structure 24 with an optional release mechanism 1601 in a "load" position, such as with a vacuum 105 applied thereto. The optional release mechanism includes the release plate 1601 (shown in the "load" position), a chamber for the actuation spring 601, the actuation spring 206 used to separate the solder spheres 201 from the apertures 202, and the resultant downward force 1603. The release mechanism may be operated by applying vacuum forces 1606 through vacuum chambers 1604 to raise the release plate 1601 to the "load" position against the resultant downward preload force 1603. The solder spheres 201 are held in the apertures 202 of the foil 203 by a vacuum force 1607 provided through vacuum tunnel 1605 transferred to a chamber 1608 created between the raised release plate 1601 and the foil 203. The aperture 202 within the foil 203 can be formed with a trapezoidal cross section as shown by the difference between the dimension 1609 against the vacuum block and the dimension 1610 which is exposed.

Figure 17:
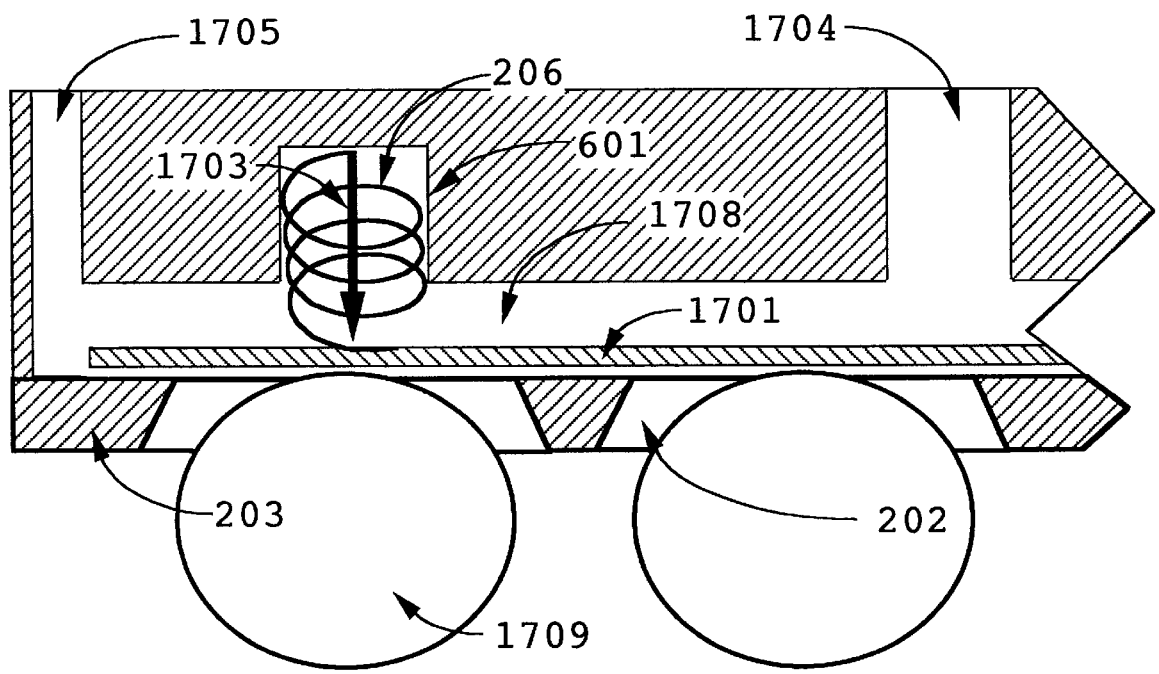
FIG. 17 is an exploded cross-sectional view of a foil and block structure with a release plate in a "release" position.

FIG. 17 is a cross-sectional side view of the foil 22 and block structure 24 and the optional release mechanism 1701 with vacuum 105 deactivated (zero vacuum force applied) and the optional release mechanism 204 and 206 in the "release" position. The optional release mechanism includes the release plate 1701 (shown in the "release" position), a chamber for the actuation spring 601, the actuation spring 206 used to separate the solder spheres 201 from the apertures 202, and the resultant downward release force 1703. The release mechanism may be operated by deactivating vacuum forces (zero vacuum applied) 106 through vacuum chambers 1704 to lower the release plate 1701 to the "release" position. When deactivating vacuum forces 106, zero vacuum force is applied to the vacuum chamber 1708 through the vacuum channel 1705, the released solder spheres 1709 are no longer secured in the apertures 202 of the foil 203 and are further separated by the downward action of the release plate 1701.

Figure 18:
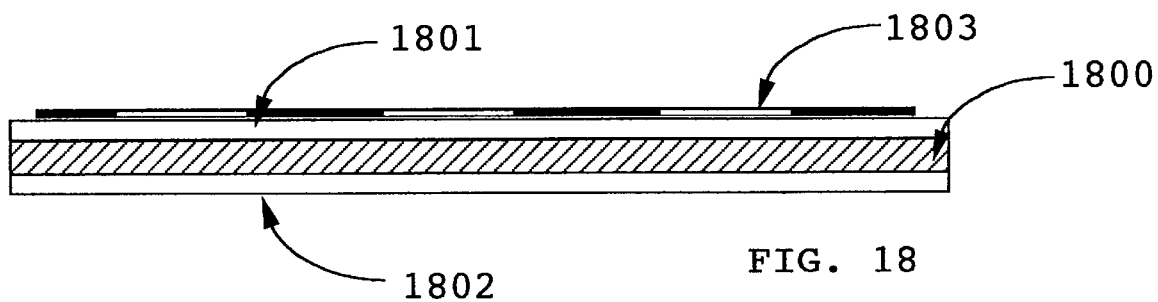
FIGS. 18, 19, 20, and 21 are cross-sectional side views of a pin plate and represent steps in making a pin plate for use in accordance with a preferred embodiment of the present invention.

FIGS. 18, 19, 20, and 21 are cross-sectional side views of a "pin" plate and represent steps in making same used for the release plate for use in accordance with a preferred embodiment of the present invention or the holding plate of an alternative embodiment of the present invention. FIG. 18 illustrates the raw material 1800 similar to that of 800 before etched with phototooling 1801 laminated on the pin side of the raw material and, phototooling or etched resistant 1802 laminated on the nonpin side of the raw material 1800. The artwork 1803 is placed on top of phototool 1801 on the pin side of the plate 1800.

Figure 19:
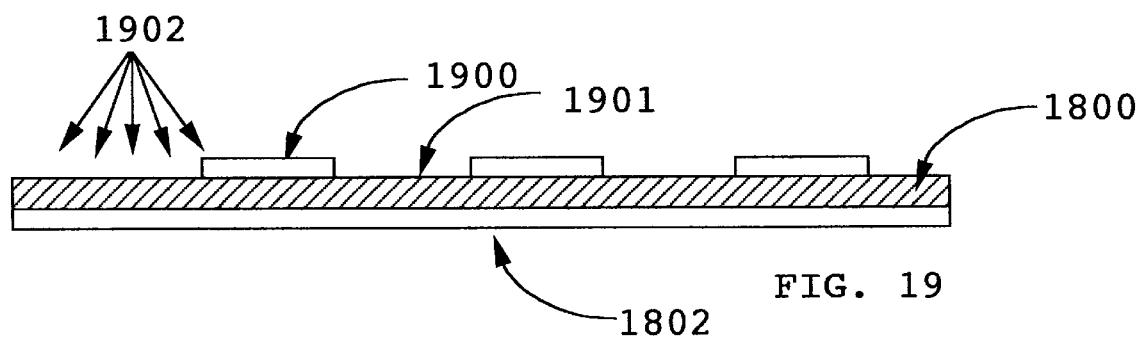

FIG. 19 shows the cross section of the pin plate showing the raw material 1800, the cured etched resist 1802 the photodeveloped tooling 1900 to create the pins (not shown), the exposed area of raw material 1901 to create the relief's (not shown) by exposing the assembly to chemical etchant 1902.

Figure 20:
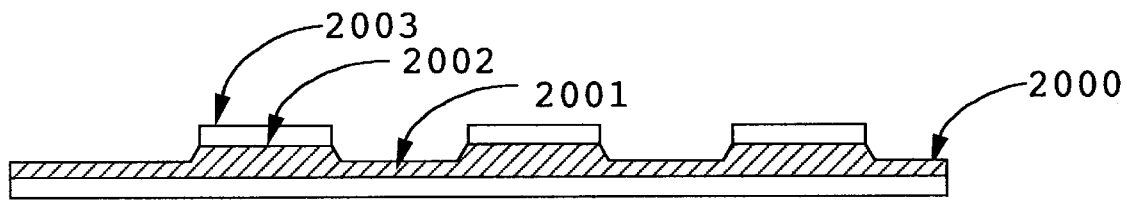

FIG. 20 shows a cross section of the pin plate 2000 after the etching process, detailing; the etched relief area 2001, the non-etched pins 2002, and the phototooling 2003.

Figure 21:
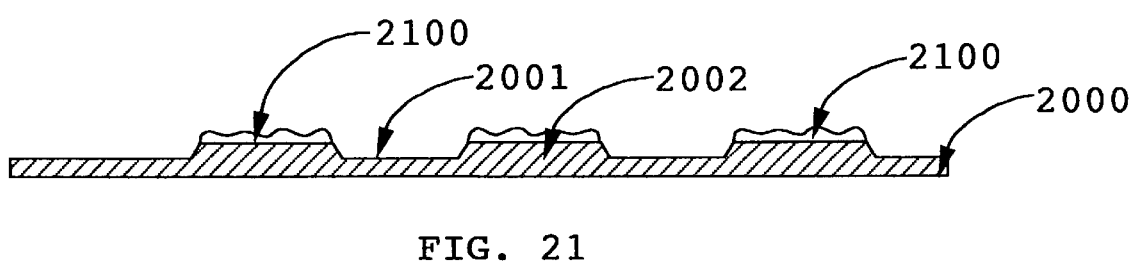

FIG. 21 shows a cross section of the pin plate 2000 in accordance with the alternative embodiment as a holding plate detailing the relief area 2001 the non-etched pin area 2002 and a holding medium (i.e. reusable adhesive) 2100.

Figure 22:
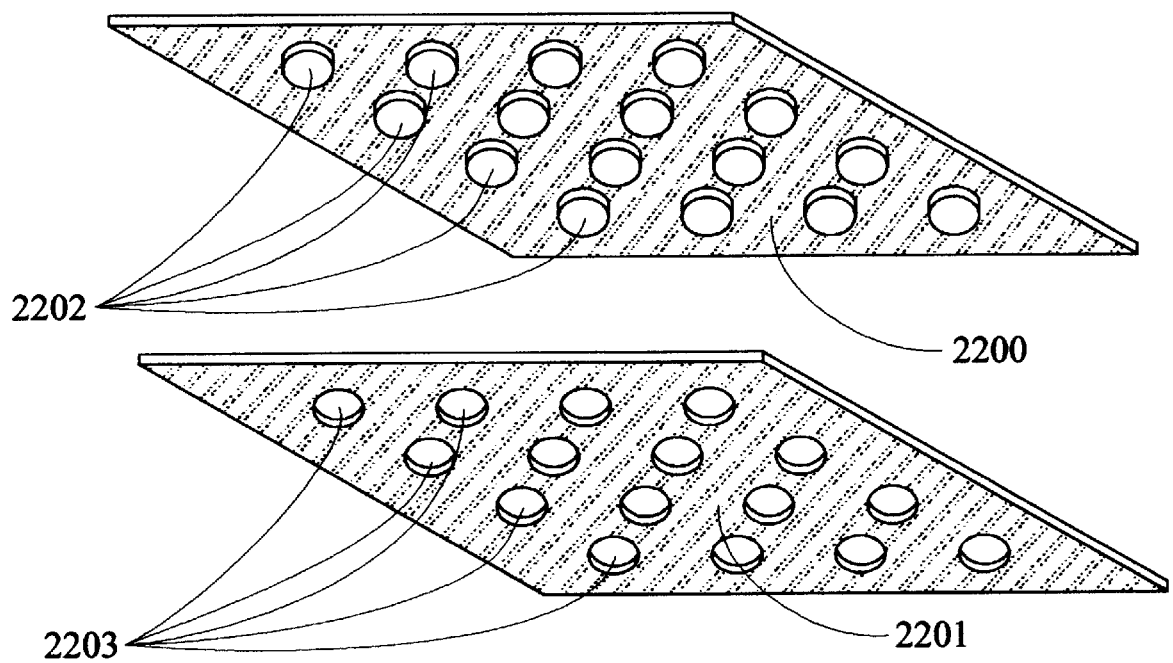
FIG. 22 is an isometric view of a pin plate and a foil according to a preferred embodiment of the present invention.

FIG. 22 is an isometric view of a pin plate 2200 and a foil 2201 according to a preferred embodiment of the present invention. The created pins 2202 are formed in a pattern similar to the apertures 2203 formed in the foil 2201.

Figure 23:
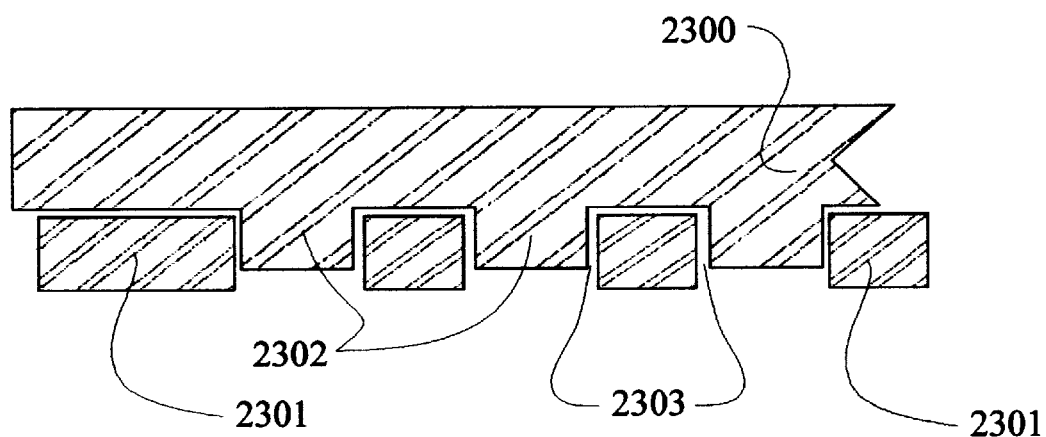
FIG. 23 is a cross-sectional side view of a portion of the pin plate and a foil of FIG. 22 according to a preferred embodiment of the present invention.

FIG. 23 is a cross-sectional side view of a portion of the pin plate 2300 and a foil 2301 of FIG. 22 for use as a release mechanism according to a preferred embodiment of the present invention. The detail illustrates the pins 2302 relationship with the apertures 2303. One can recognize that the length of the pins 2302 may vary in relations to the thickness of the foil 2301.

Figure 24:
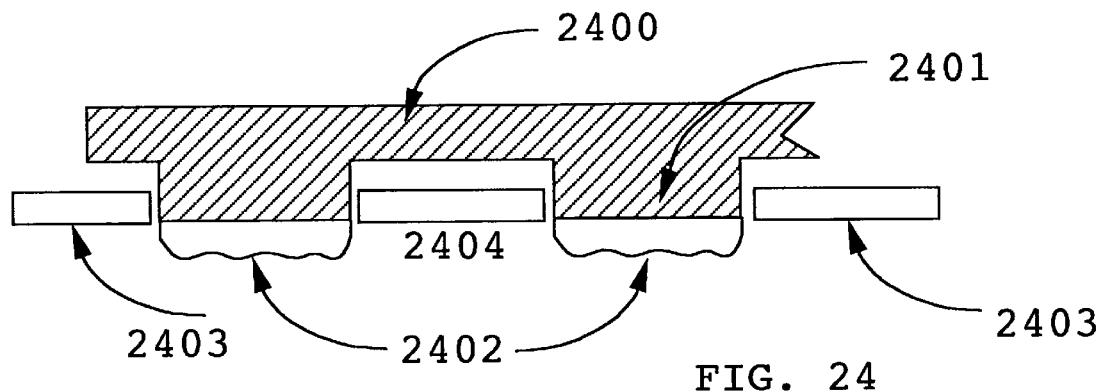
FIGS. 24, 25, and 26 are cross-sectional side views of a holding plate and foil, and represent steps in using the holding plate in accordance with a preferred embodiment of the present invention.
Figure 25:
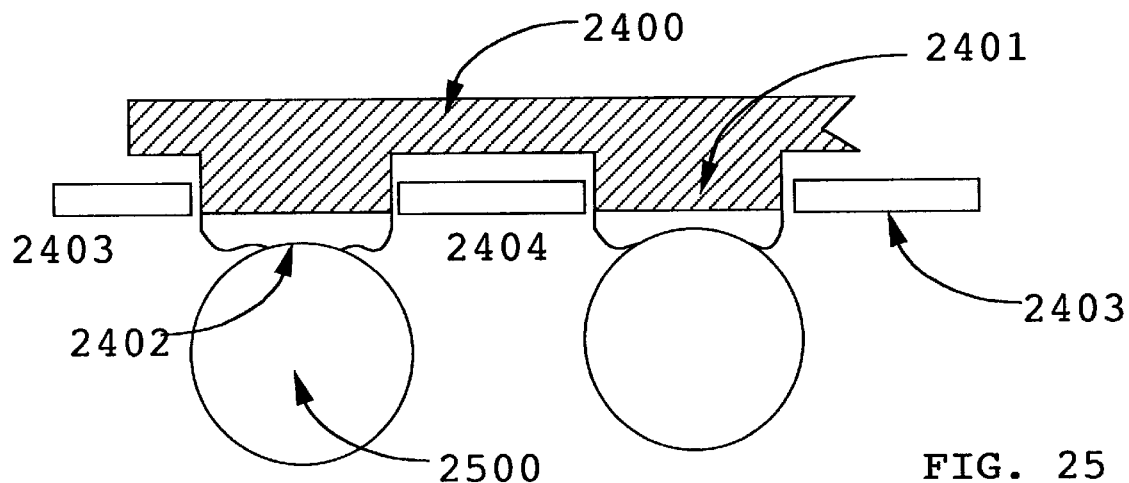
Figure 26:
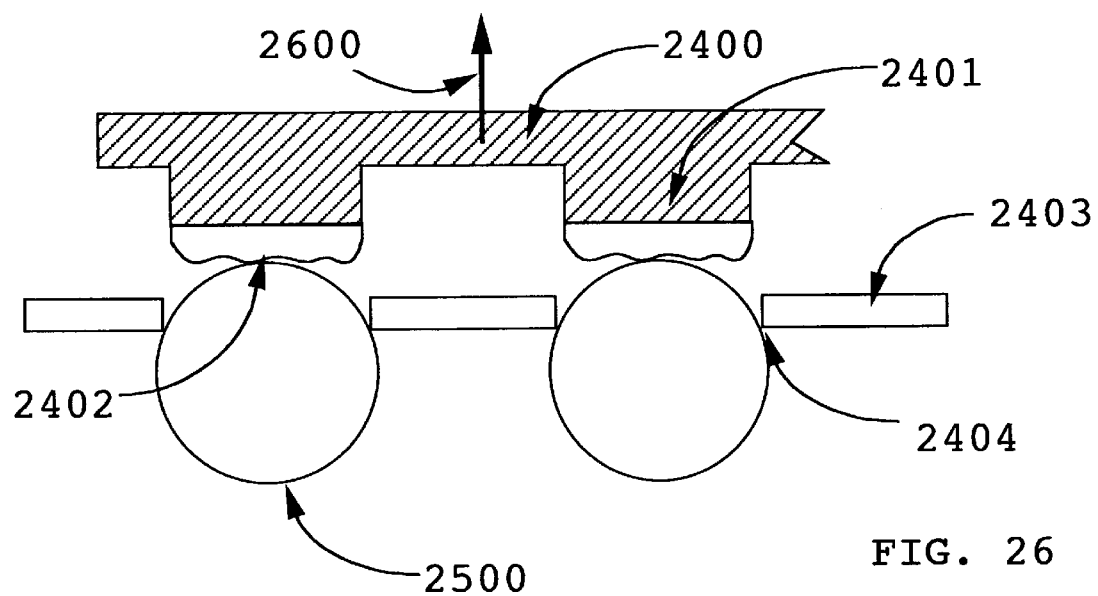

FIGS. 24, 25, and 26 are cross-sectional side views of a holding plate 2400 and release foil 2403, and represent steps in using the holding plate in accordance with an alternative embodiment of the present invention. FIG. 24 illustrates the holding plate 2400, the holding pins 2401, and a tacky medium 2402. Along with their relation to the foil 2403 and its apertures 2404 in the load position.

FIG. 25 is a detail of the holding plate 2400, the holding pins 2401, and a tacky medium 2402. Along with their relation to the foil 2403 and its apertures 2404 in the load position after exposure to a reservoir (not shown) of conductive preforms 2500.

FIG. 26 illustrates the motion 2600 of the holding plate 2400 to separate the conductive preforms 2500 from the tacky media 2402 on the pins 2401 by using the apertures 2404 of the foil 2403.

What is claimed is:

1. A method for placing a plurality of conductive preforms on a plurality of electronic pads, the method comprising the steps of:

holding a plurality of conductive preforms at least partially within a plurality of openings in a foil wherein the openings have at least one exposed diameter that is equal to or larger then the diameter of the conductive preforms by providing a holding force to the plurality of conductive preforms;

locating the plurality of conductive preforms at a plurality of electronic pads; and placing the plurality of conductive preforms on the plurality of electronic pads by removing the holding force from the plurality of conductive preforms.

2. The method of claim 1, wherein the holding force comprises of at least one vacuum force provided through the plurality of openings in the foil and adhesive force provided through the plurality of openings in the foil.

3. The method of claim 1, wherein the holding force comprises of at least one vacuum force provided to the plurality of conductive preforms through the plurality of openings in the foil, and wherein the placing step comprises the steps of:

releasing the plurality of conductive preforms from the plurality of openings in the foil by removing the vacuum force from the plurality of conductive preforms; and applying placing force to the plurality of conductive preforms in the direction of the plurality of electronic pads.

4. The method of claim 1, wherein the holding force comprises adhesive force applied by a retaining structure removably attached to the plurality of conductive preforms through the plurality of openings in the foil, and wherein the placing step comprises the step of:

releasing the plurality of conductive preforms from the plurality of openings in the foil by removing the adhesive force from the plurality of conductive preforms by retracting the retaining structure from the foil to detach the retaining structure from the plurality of conductive preforms.

5. An apparatus for placing a plurality of conductive preforms on a plurality of electronic pads, the apparatus comprising:

a foil including a plurality of openings therein for holding and placing a plurality of conductive preforms at least partially within the plurality of openings, wherein the openings have at least one exposed diameter that is equal to or larger then the diameter of the conductive preform; and means for removably providing a holding force to the plurality of conductive preforms for holding the plurality of conductive preforms at least partially within the plurality of openings and for placing the plurality of conductive preforms on a plurality of electronic pads on a substrate by removing the holding force from the plurality of conductive preforms.

6. The apparatus of claim 5, wherein the plurality of openings in the foil are constructed using at least one of the following production processes:

(a) chemically etching the foil utilizing predefined artwork masking for the pattern of the plurality of openings;

(b) laser drilling the foil utilizing a predefined pattern for drilling the plurality of openings;

(c) mechanically drilling the foil utilizing a predefined pattern for drilling the plurality of openings;

(d) polishing the foil; and (e) plating the foil with a metallic surface including at least one of the following: gold plating, silver plating, copper plating, nickel plating, and polytetraflouroethylene (also known as Teflon) plating.

7. The apparatus of claim 5, wherein the plurality of conductive preforms comprises a plurality of solder spheres having a predefined minimum diameter, and wherein the plurality of openings in the foil comprises a plurality of openings having an opening diameter that is a predefined maximum diameter, the predefined maximum diameter being less than the predefined minimum diameter, for holding the plurality of solder spheres to the plurality of openings having the opening diameter that is a predefined maximum diameter by holding force being applied to the plurality of solder spheres through the plurality of openings having the opening diameter that is a predefined maximum diameter.

8. The apparatus of claim 7, wherein the plurality of openings in the foil are constructed using at least one of the following production processes:

(a) chemically etching the foil utilizing predefined artwork masking for the pattern of the plurality of openings;

(b) laser drilling the foil utilizing a predefined pattern for drilling the plurality of openings;

(c) mechanically drilling the foil utilizing a predefined pattern for drilling the plurality of openings;

(d) polishing the foil; and (e) plating the foil with a metallic surface including at least one of the following: gold plating, silver plating, copper plating, nickel plating, and polytetraflouroethylene (also known as Teflon) plating.

9. An apparatus for placing a plurality of conductive preforms on a plurality of electronic pads on a substrate, the apparatus comprising:

a foil including a plurality of openings therein for holding a plurality of conductive preforms to the plurality of openings, wherein the openings have at least one exposed diameter that is equal to or larger then the diameter of the conductive preforms, by a holding force applied to the plurality of conductive preforms through the plurality of openings;

a supporting structure mechanically coupled to the foil for supporting the foil; and means for removably providing the holding force to the plurality of conductive preforms through the plurality of openings in the foil for holding the plurality of conductive preforms to the plurality of openings and for placing the plurality of conductive preforms on a plurality of electronic pads on a substrate by removing the holding force from the plurality of conductive preforms.

10. The apparatus of claim 9, wherein the plurality of openings in the foil are constructed using at least one of the following production processes:

(a) chemically etching the foil utilizing predefined artwork masking for a pattern of the plurality of openings;

(b) laser drilling the foil utilizing a predefined pattern for drilling the plurality of openings;

(c) mechanically drilling the foil utilizing a predefined pattern for drilling the plurality of openings;

(d) polishing the foil; and (e) plating the foil with a metallic surface including at least one of the following: gold plating, silver plating, copper plating, nickel plating, and polytetraflouroethylene (also known as Teflon) plating.

11. The apparatus of claim 9, wherein the plurality of conductive preforms comprises a plurality of solder spheres having a predefined minimum diameter, and wherein the plurality of openings in the foil comprises a plurality of openings having an opening diameter that is a predefined maximum diameter, the predefined maximum diameter being less than the predefined minimum diameter, for holding the plurality of solder spheres to the plurality of openings having the opening diameter that is a predefined maximum diameter by the holding force being applied to the plurality of solder spheres through the plurality of openings having the opening diameter that is a predefined maximum diameter.

12. The apparatus of claim 9, wherein the means for removably providing the holding force comprises:

a retaining structure for providing adhesive force to the plurality of conductive preforms through the plurality of openings in the foil for holding the plurality of conductive preforms to the plurality of openings and for placing the plurality of conductive preforms on a plurality of electronic pads on a substrate by removing the adhesive force from the plurality of conductive preforms by retracting the retaining structure from the foil to detach the retaining structure from the plurality of conductive preforms.

13. The apparatus of claim 9, wherein the means for removably providing the holding force comprises:

a housing, mechanically coupled to the foil, the housing having a vacuum port capable of being mechanically coupled to a vacuum source for providing a vacuum force to the plurality of conductive preforms through the plurality of openings in the foil for holding the plurality of conductive preforms to the plurality of openings and for placing the plurality of conductive preforms on a plurality of electronic pads on a substrate by removing the vacuum force from the plurality of conductive preforms.

14. The apparatus of claim 13, further comprising:

a release mechanism, mechanically coupled to the housing, for applying placing force to the plurality of conductive preforms through the plurality of openings in the foil in the direction of the plurality of electronic pads for placing the plurality of conductive preforms on a plurality of electronic pads on a substrate by removing the vacuum force from and by applying the placing force to the plurality of conductive preforms.

15. The apparatus of claim 14, wherein the release mechanism comprises:

a release plate including a plurality of bumps corresponding to the plurality of openings in the foil, the plurality of bumps being formed to at least partly protrude into the plurality of openings in the foil when the release plate is adjacent to the foil; and a spring, mechanically coupled to the foil and to the release plate, the release plate being retractable in the housing away from the foil at decreasing spring energy in the spring and the release plate being positionable toward the foil at increasing spring energy in the spring, the release plate being positioned toward the foil to position the plurality of bumps in the corresponding plurality of openings in the foil to apply the placing force to the plurality of conductive preforms for placing the plurality of conductive preforms on a plurality of electronic pads on a substrate.

16. The apparatus of claim 14, wherein the release mechanism comprises:

a release plate including a plurality of bumps corresponding to the plurality of openings in the foil, the plurality of bumps being formed to at least partly protrude into the plurality of openings in the foil when the release plate is adjacent to the foil; and a spring, mechanically coupled to the housing and to the release plate, the release plate being retractable in the housing away from the foil at increasing spring energy in the spring and the release plate being positionable toward the foil at reducing spring energy in the spring, the release plate being positioned toward the foil to position the plurality of bumps in the corresponding plurality of openings in the foil to apply the placing force to the plurality of conductive preforms for placing the plurality of conductive preforms on a plurality of electronic pads on a substrate.

17. The apparatus of claim 16, wherein the release mechanism further comprises:

a vacuum channel in the housing and pneumatically coupled to the release plate, and capable of being pneumatically coupled to a vacuum source, for providing a first vacuum force to the release plate to position the release plate in the housing to retract the release plate away from the foil and for providing a second vacuum force to the release plate to position the release plate toward the foil to position the plurality of bumps in the corresponding plurality of openings in the foil to apply the placing force to the plurality of conductive preforms for placing the plurality of conductive preforms on a plurality of electronic pads on a substrate.

18. A apparatus for placing a plurality of conductive preforms on a plurality of electronic pads, the apparatus comprising:

a foil including a plurality of openings therein for holding and placing a plurality of conductive preforms in the plurality of openings, wherein the openings have at least one exposed diameter that is equal to or larger then the diameter of the conductive preforms;

means for removably providing a holding force to the plurality of conductive preforms in the plurality of openings of the foil, wherein the holding force holds the plurality of conductive preforms in the plurality of openings and a means for removing the holding force for placing the plurality of conductive preforms onto a plurality of electronic pads on a substrate; and a second member whereby, the second member is used to maintain the solder spheres in the plurality of openings in the foil.

19. The apparatus of claim 18, wherein the apparatus further comprises:

a means for applying a placing force to the solder spheres through the openings in the foil.

20. The apparatus of claim 5, wherein the apparatus further comprises:

a means for applying a placing force to the solder spheres through the openings in the foil.

21. The apparatus of claim 19, whereby the means for applying a placing force comprises a plurality of pins, and a compliant member positioned behind the plurality of pins.

22. The apparatus of claim 20, whereby the means for applying a placing force comprises a plurality of pins.

23. The apparatus of claim 22, whereby the means for applying a placing force further comprises a compliant member positioned behind the plurality of pins.

* * * * *